(12) United States Patent
Kawakami et al.

(10) Patent No.: US 11,901,201 B2
(45) Date of Patent: Feb. 13, 2024

(54) SEMICONDUCTOR MANUFACTURING APPARATUS AND METHOD OF MANUFACTURING SEMICONDUCTOR DEVICE

(71) Applicant: Mitsubishi Electric Corporation, Tokyo (JP)

(72) Inventors: Shunichi Kawakami, Tokyo (JP); Takaya Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/819,848

(22) Filed: Aug. 15, 2022

(65) Prior Publication Data

US 2023/0131572 A1   Apr. 27, 2023

(30) Foreign Application Priority Data

Oct. 26, 2021   (JP) .................................. 2021-174671

(51) Int. Cl.
*B32B 43/00* (2006.01)
*H01L 21/67* (2006.01)
*H01L 21/683* (2006.01)

(52) U.S. Cl.
CPC .... *H01L 21/67132* (2013.01); *H01L 21/6836* (2013.01); *B32B 43/006* (2013.01); *Y10T 156/1132* (2015.01); *Y10T 156/1179* (2015.01); *Y10T 156/1944* (2015.01); *Y10T 156/1983* (2015.01)

(58) Field of Classification Search
CPC ............. B32B 43/006; Y10T 156/1132; Y10T 156/1179; Y10T 156/1944; Y10T 156/1983
See application file for complete search history.

(56) References Cited

U.S. PATENT DOCUMENTS

| | | | | |
|---|---|---|---|---|
| 6,824,643 | B2 * | 11/2004 | Yoshimoto | ........ H01L 21/67132 438/464 |
| 8,250,742 | B2 * | 8/2012 | Kloeckner | ........ H01L 21/67132 29/762 |
| 9,039,867 | B2 * | 5/2015 | Barmettler | ........ H01L 21/67005 156/716 |

(Continued)

FOREIGN PATENT DOCUMENTS

| | | |
|---|---|---|
| JP | 2006-156806 A | 6/2006 |
| JP | 2014-165302 A | 9/2014 |
| JP | 2017-224640 A | 12/2017 |

*Primary Examiner* — Philip C Tucker
*Assistant Examiner* — Nickolas R Harm
(74) *Attorney, Agent, or Firm* — Studebaker & Brackett PC

(57) ABSTRACT

A semiconductor manufacturing apparatus includes: a sheet separation jig having contact with a rear surface of a sheet which is a surface of the sheet on a side opposite to a front surface of the sheet, wherein the sheet separation jig includes therein a plurality of support blocks each having a first suction hole formed for sucking the rear surface of the sheet and a single driving plate connected to the plurality of support blocks so that the plurality of support blocks can move in a first direction as a direction away from the sheet with a time difference, and the plurality of support blocks are disposed in the sheet separation jig along a second direction, as a direction of a separation of the semiconductor device from the sheet, intersecting the first direction.

22 Claims, 13 Drawing Sheets

(56) References Cited

U.S. PATENT DOCUMENTS

| | | | |
|---|---|---|---|
| 2008/0318346 A1* | 12/2008 | Maki | H01L 21/6838 257/E21.53 |
| 2010/0252205 A1* | 10/2010 | Chan | H01L 21/67132 156/707 |
| 2011/0192547 A1* | 8/2011 | Yip | H01L 21/6838 156/758 |

* cited by examiner

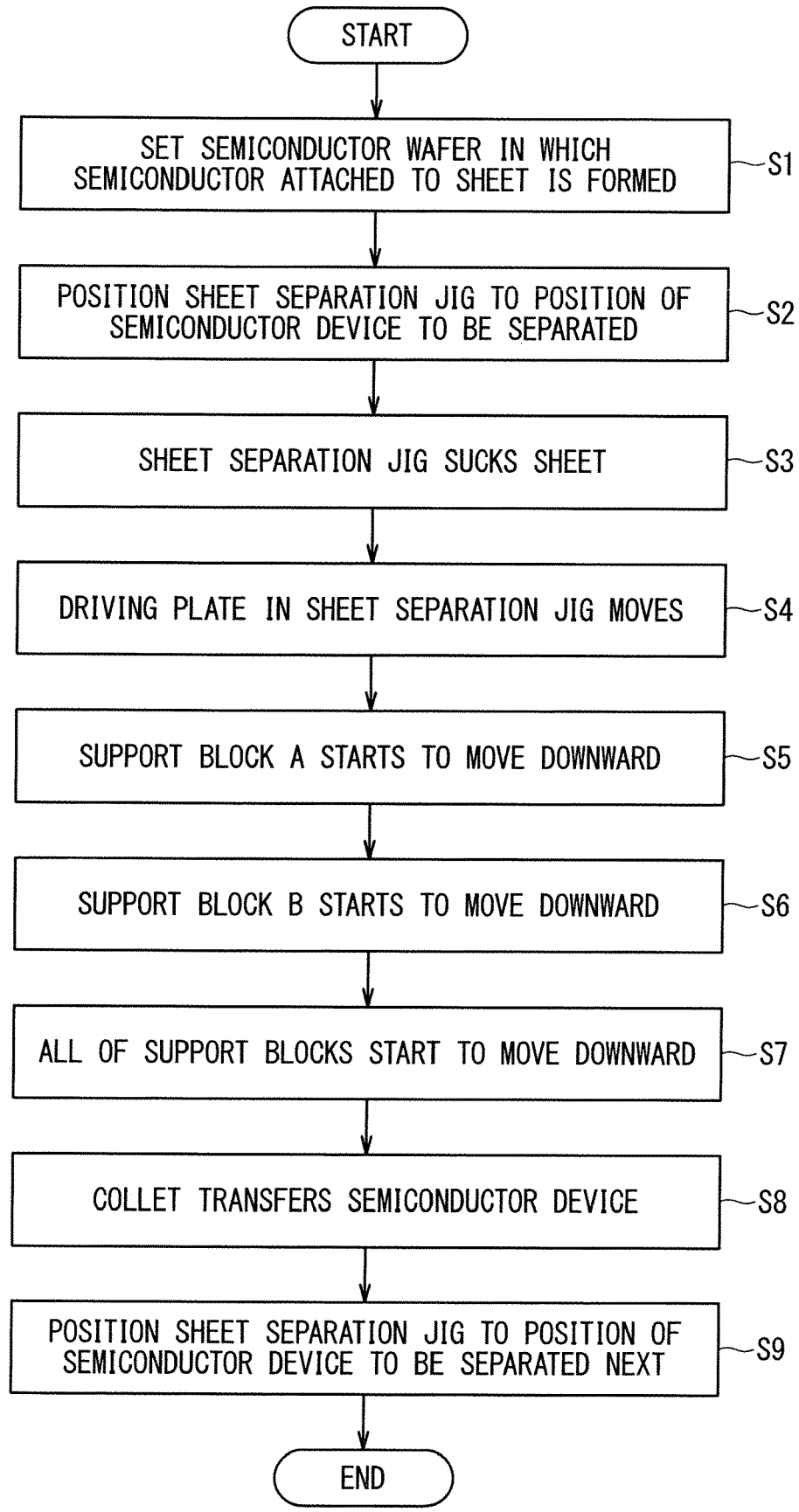

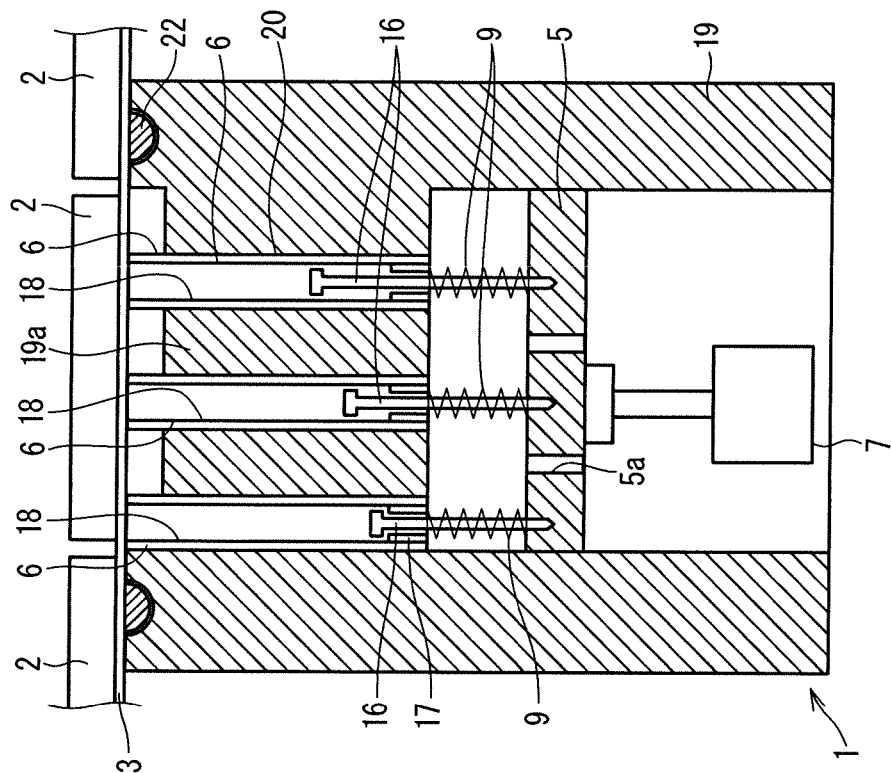
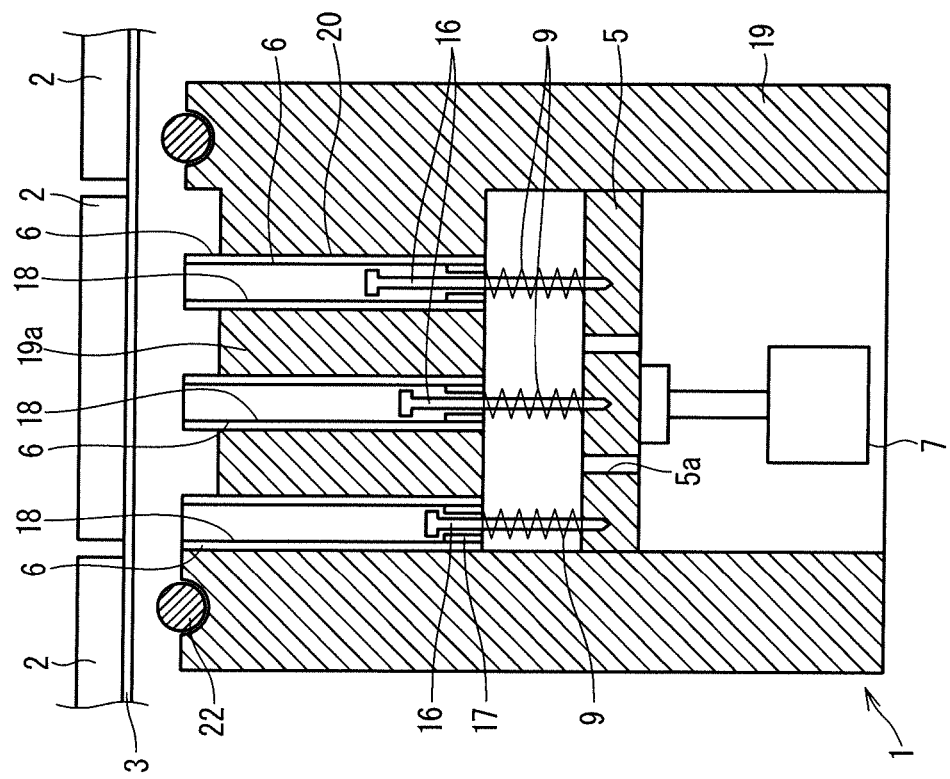

SEMICONDUCTOR MANUFACTURING APPARATUS AND METHOD OF MANUFACTURING SEMICONDUCTOR DEVICE

BACKGROUND OF THE INVENTION

Field of the Invention

The present disclosure relates to a semiconductor manufacturing apparatus and a method of manufacturing a semiconductor device.

Description of the Background Art

A plurality of semiconductor devices are formed in a semiconductor wafer, and each semiconductor device is divided into pieces by dicing, and then transferred to a mounting process to be manufactured. After dicing, a pickup apparatus for picking up the semiconductor device is used for separating each semiconductor device from a sheet.

There is a device including a pickup jig provided with a plurality of needles having an equal height as a conventional pickup apparatus for the semiconductor device, and in such a device, the semiconductor device is pushed up from a side of an adhesive sheet with the needles.

However, when the conventional pickup apparatus for the semiconductor device is used for a semiconductor device thinned to have a thickness of 100 μm or less, for example, there is a problem that a crack occurs in the semiconductor device by the needles.

Thus, for example, Japanese Patent Application Laid-Open No. 2006-156806 discloses a separation apparatus having a structure of not using needles at a time of pickup but using a slider moving in a lateral direction to reduce a crack of a semiconductor device at the time of pickup.

For example, each of Japanese Patent Application Laid-Open No. 2014-165302 and Japanese Patent Application Laid-Open No. 2017-224640 discloses a separation apparatus which does not use needles at a time of pickup but operates a support block in a vertical direction to reduce a crack of a semiconductor device at the time of pickup.

SUMMARY

Increased are not only improvement in performance by reducing a thickness of a semiconductor wafer but also a demand for a semiconductor device made of an expensive compound semiconductor material such as silicon carbide and gallium nitride as a main material in a field of a power semiconductor. Thus, there is a demand for also using a semiconductor device formed in an outer peripheral part of the semiconductor wafer with zero waste.

Performed in a technique described in Japanese Patent Application Laid-Open No. 2006-156806 is expanding for expanding a dicing sheet at a time of picking up the semiconductor device formed in the outer peripheral part of the semiconductor wafer to improve a pickup property of the semiconductor device. However, the slider moves in the lateral direction, thus there is a problem that the slider may interfere with an inner wall of a cylindrical stage, and a semiconductor device formed in the outer peripheral part of the semiconductor wafer on a side of a movement direction of the slider cannot be picked up.

In the technique described in Japanese Patent Application Laid-Open No. 2006-156806, when the movement direction of the slider is reversed, the semiconductor device formed in the outer peripheral part of the semiconductor wafer can be picked up, however, there is a problem that a structure is complicated by reason that an arm rotational axis needs to be newly added, for example, thus a size of an apparatus and a manufacturing cost thereof increase.

In the techniques in Japanese Patent Application Laid-Open No. 2014-165302 and Japanese Patent Application Laid-Open No. 2017-224640, the semiconductor device formed in the outer peripheral part of the semiconductor wafer can be picked up, however, there is a problem that a structure is complicated by reason that a driving source needs to be provided for each support block to operate the support block in the vertical direction, thus a size of an apparatus and a manufacturing cost thereof increase.

An object of the present disclosure is to provide a technique capable of picking up a semiconductor device formed in an outer peripheral part of a semiconductor wafer and suppressing a crack occurring in the semiconductor device at a time of separating the semiconductor device from a sheet with a simple configuration.

A semiconductor manufacturing apparatus according to the present disclosure is a semiconductor manufacturing apparatus separating a semiconductor device attached to a front surface of a sheet from the sheet. The semiconductor manufacturing apparatus includes a die having contact with a rear surface of the sheet which is a surface of the sheet on a side opposite to the front surface of the sheet. The die includes a plurality of support blocks and a single drive member therein. A first suction hole for sucking the rear surface of the sheet is formed in each of the plurality of support blocks. The single drive member is connected to the plurality of support blocks so that the plurality of support blocks can move in a first direction as a direction away from the sheet with a time difference. The plurality of support blocks are disposed in the die along a second direction, as a direction of a separation of the semiconductor device from the sheet, intersecting the first direction.

The plurality of support blocks moves in the first direction as the direction away from the sheet with the time difference by the single drive member, thus the semiconductor device formed in the outer peripheral part of the semiconductor wafer can be picked up with a simple configuration, and a crack occurring in the semiconductor device at the time of separating the semiconductor device from the sheet can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a flow chart illustrating a procedure of separating a semiconductor device from the sheet in the semiconductor manufacturing apparatus according to the embodiment 1.

FIGS. 6A and 6B are cross-sectional views each illustrating a part of a semiconductor manufacturing apparatus according a modification example 1 of the embodiment 1.

DESCRIPTION OF THE PREFERRED EMBODIMENTS

Embodiment 1

<Whole Configuration>

Figure 1:
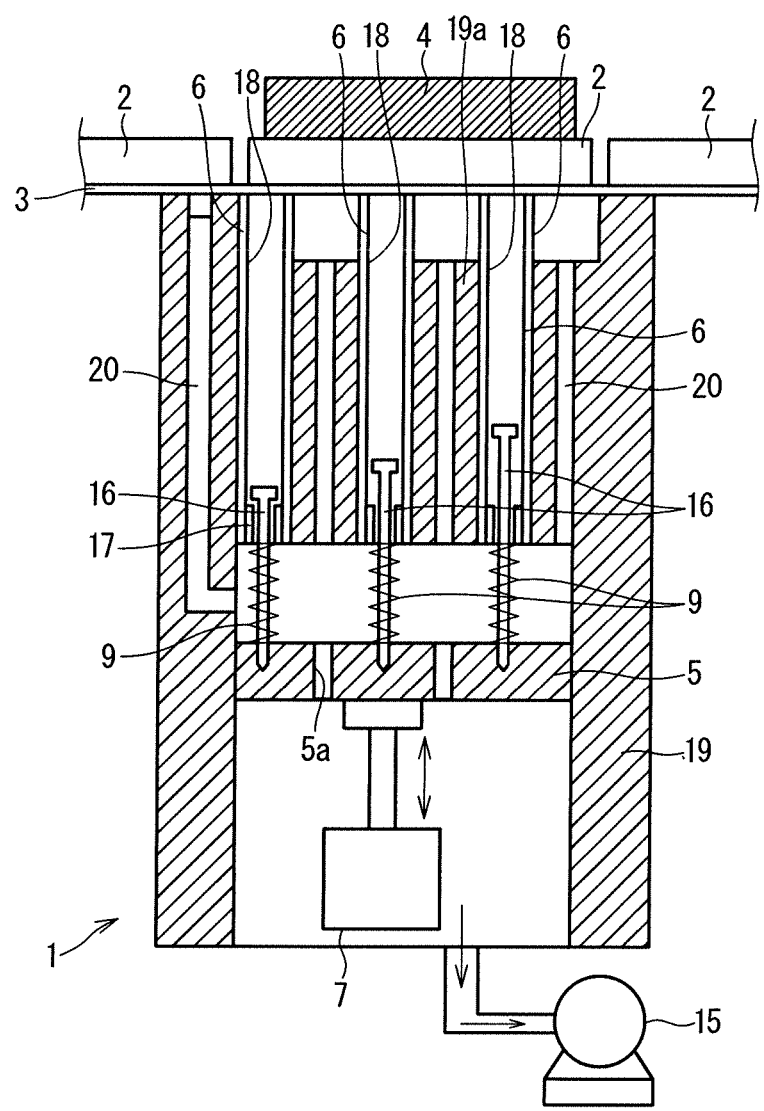
FIG. 1 is a cross-sectional view illustrating a part of a semiconductor manufacturing apparatus according to an embodiment 1.
Figure 2:
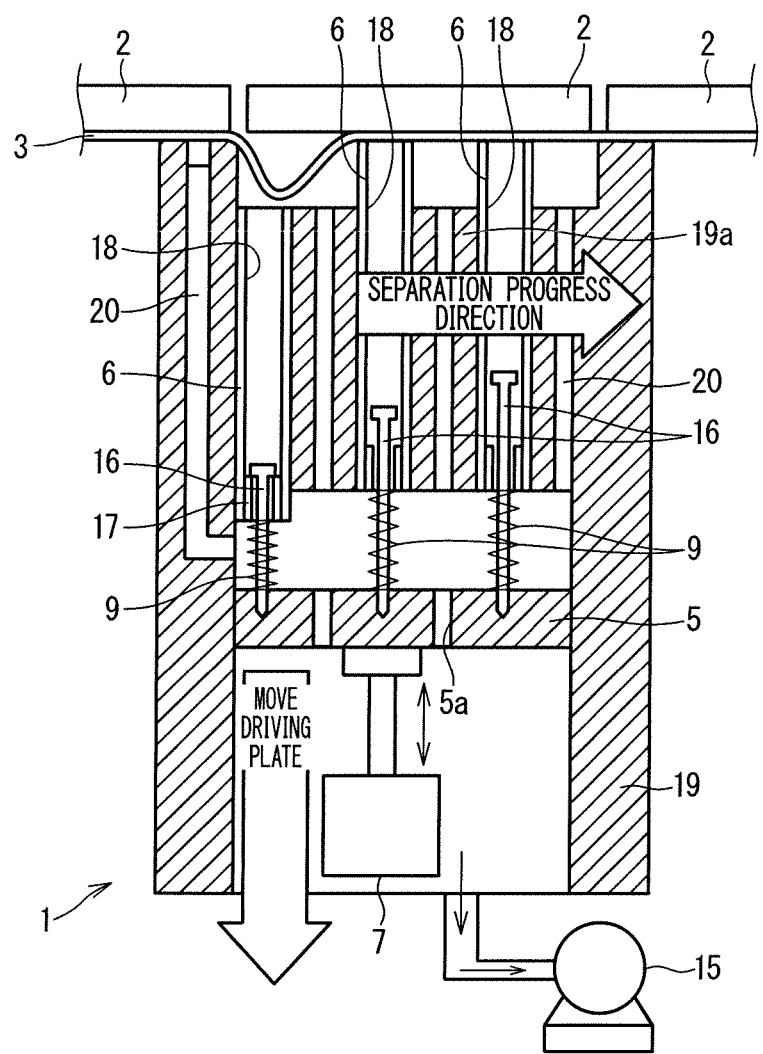
FIG. 2 is a cross-sectional view illustrating a sheet separation operation of the semiconductor manufacturing apparatus according to the embodiment 1.
Figure 3:
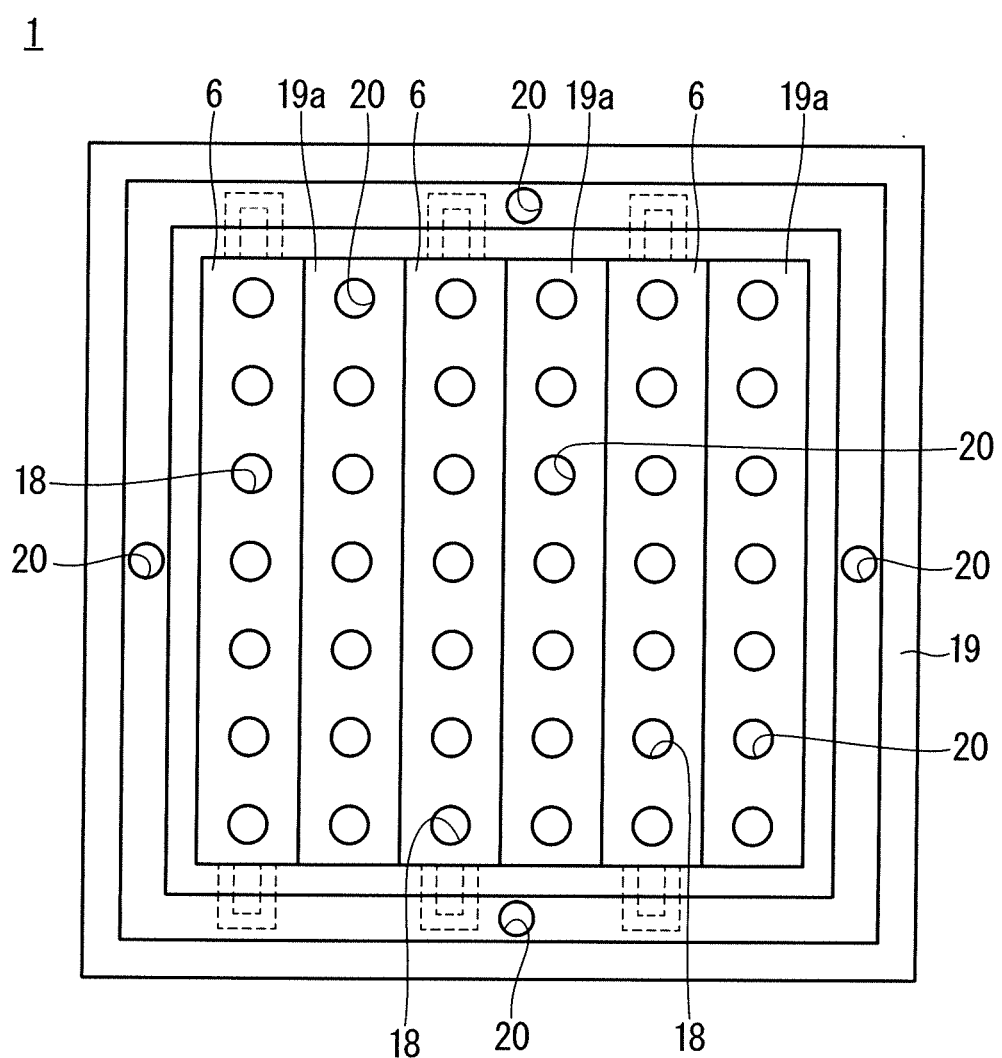
FIG. 3 is a top view of a sheet separation jig included in the semiconductor manufacturing apparatus according to the embodiment 1.
Figure 4:
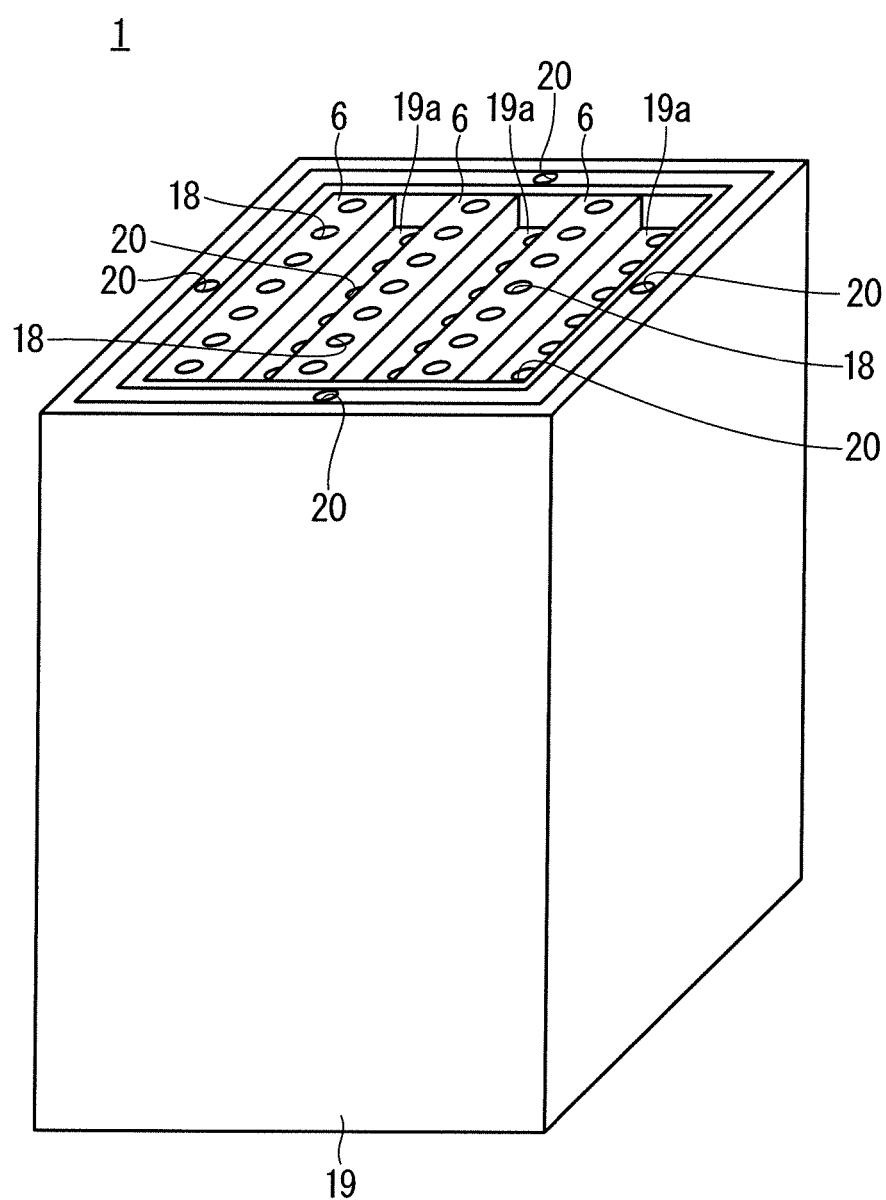
FIG. 4 is a perspective view of the sheet separation jig included in the semiconductor manufacturing apparatus according to the embodiment 1.

An embodiment 1 is described hereinafter using the drawings. FIG. 1 is a cross-sectional view illustrating a part of a semiconductor manufacturing apparatus according to the embodiment 1. FIG. 2 is a cross-sectional view illustrating a sheet separation operation of the semiconductor manufacturing apparatus according to the embodiment 1. FIG. 3 is a top view of a sheet separation jig 1 included in the semiconductor manufacturing apparatus according to the embodiment 1. FIG. 4 is a perspective view of the sheet separation jig 1 included in the semiconductor manufacturing apparatus according to the embodiment 1.

As illustrated in FIG. 1, the semiconductor manufacturing apparatus is an apparatus attaching a semiconductor device 2 to a front surface of a sheet 3 having stretchability and dividing the semiconductor device 2 into pieces by dicing to divide the plurality of semiconductor devices 2 formed on a semiconductor wafer into the pieces as chips, and then separating the divided semiconductor devices 2 from the sheet 3. The sheet 3 is a dicing sheet or a mounting sheet.

The semiconductor manufacturing apparatus includes a sheet separation jig 1 (corresponding to a die), a first suction source 15, and a collet 4.

The sheet separation jig 1 is disposed on a side of a rear surface of the sheet 3 which is a surface of the sheet 3 on a side opposite to the front surface thereof. The sheet separation jig 1 is formed into a cylindrical shape passing in an up-down direction, and an upper end of the sheet separation jig 1 has contact with the rear surface of the sheet 3. The sheet separation jig 1 includes therein a plurality of (three, for example) support blocks 6, a single driving plate 5 (corresponding to a drive member), and a first power source 7 such as an air cylinder.

Each support block 6 includes a first suction hole 18 extending in the up-down direction. The three support blocks 6 are disposed along a second direction as a direction in which a separation of the semiconductor device 2 from the sheet 3 proceeds in the sheet separation jig 1. The second direction is a direction from left to right in FIG. 1. That is to say, the three support blocks 6 are disposed from left to right in FIG. 1.

The driving plate 5 is disposed on a lower side of the three support blocks 6. A width of the driving plate 5 in a lateral direction is slightly smaller than a width of an inner space of the sheet separation jig 1 in a lateral direction so as to be movable in the up-down direction. The first power source 7 is disposed on a lower side of the driving plate 5 to move the driving plate 5 in the up-down direction.

A bolt 16 (corresponding to a connection member) connecting each support block 6 and the driving plate 5 is inserted through each first suction hole 18 formed in each support block 6, and a head part as an end portion of each bolt 16 on a side of the support block 6 and a protruding part 17 provided on a side of the driving plate 5 in each support block 6 to protrude to an inner peripheral side thereof can be locked to each other. That is to say, when the bolt 16 is located in a downward position, the bolt 16 is locked to the protruding part 17, and when the bolt 16 is located in an upward position, the bolt 16 is not locked to the protruding part 17. A shaft part of each bolt 16 is connected to the driving plate 5.

A length of the shaft part of the bolt 16 is difference for each support block 6, and the length of the shaft part of the bolt 16 increases toward the second direction. In other words, the length of the shaft part of the bolt 16 increases toward a right side in FIG. 1. A distance from the head part of the bolt 16 to the protruding part 17 of the support block 6 is gradually increased toward the second direction, a separation of the semiconductor device 2 from the sheet 3 can proceed while a crack occurring in the semiconductor device 2 is suppressed with a simple configuration.

Each bolt 16 with a helical coil spring 9 attached thereto is disposed between each support block 6 and the driving plate 5. The helical coil spring 9 is provided to firmly attach the support block 6 to the sheet 3. The three helical coil springs 9 have the same elastic coefficient.

When the bolts 16 sequentially move in the first direction as a direction away from the sheet 3 and intersecting the second direction in order of increasing length by downward driving of the driving plate 5, that is to say, when the bolts 16 sequentially move downward in order of increasing length, the bolt 16 which has moved downward is locked to the protruding part 17, and the support block 6 connected to the bolt 16 also moves downward in conjunction with the bolt 16. Accordingly, the three support blocks 6 move downward toward the second direction with a time difference. In the meanwhile, the three support blocks 6 simultaneously move upward by upward driving of the driving plate 5.

In order to separate the semiconductor device 2 from the sheet 3, the support block 6 moves downward in a direction in which the support block 6 is away from the sheet 3 while an inner portion of the sheet separation jig 1 is depressurized by a first suction source 15, thus force of separating the sheet 3 from the semiconductor device 2 by vacuum force is obtained. In FIG. 1, the first suction source 15 is directly connected to the sheet separation jig 1, but is preferably connected thereto via a hose or tube, for example.

In the driving plate 5, a through hole 5a extending in the up-down direction is formed, and the first suction source 15 can perform vacuuming on the inner portion of the sheet separation jig 1 via the through hole 5a.

As illustrated in FIG. 1 and FIG. 2, the first suction hole 18 communicated with the first suction source 15 is provided in a surface of the support block 6 having contact with the sheet 3, thus the support block 6 can directly suck the sheet 3. Accordingly, force of separating the sheet 3 from the semiconductor device 2 is effectively applied to the sheet 3, thus progress of the separation is promoted.

The collet 4 is disposed on a surface of the semiconductor device 2 on a side opposite to a surface thereof having contact with the sheet 3, and performs vacuum suction to hold the semiconductor device 2.

As illustrated in FIG. 3 and FIG. 4, the plurality of first suction holes 18 may be formed for each support block 6. A suction hole 20 communicated with the first suction source 15 may also be formed on a sidewall 19 forming a side surface of the sheet separation jig 1 and a partition wall 19a partitioning the support blocks 6 adjacent to each other. When the inner portion of the sheet separation jig 1 can be guaranteed to have desired vacuum pressure, an upper end of the partition wall 19a may or may not have contact with the sheet 3.

<Procedure of Separating Semiconductor Device from Sheet>

Figure 7:
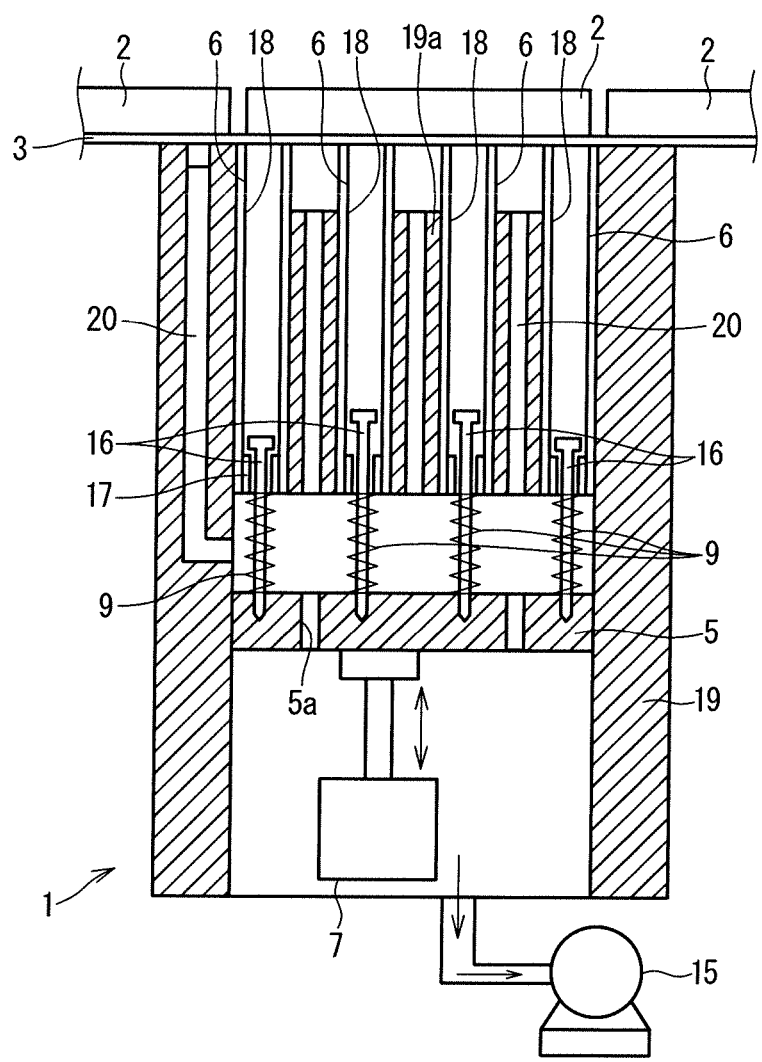
FIG. 7 is a cross-sectional view illustrating a part of a semiconductor manufacturing apparatus according a modification example 2 of the embodiment 1.
Figure 8:
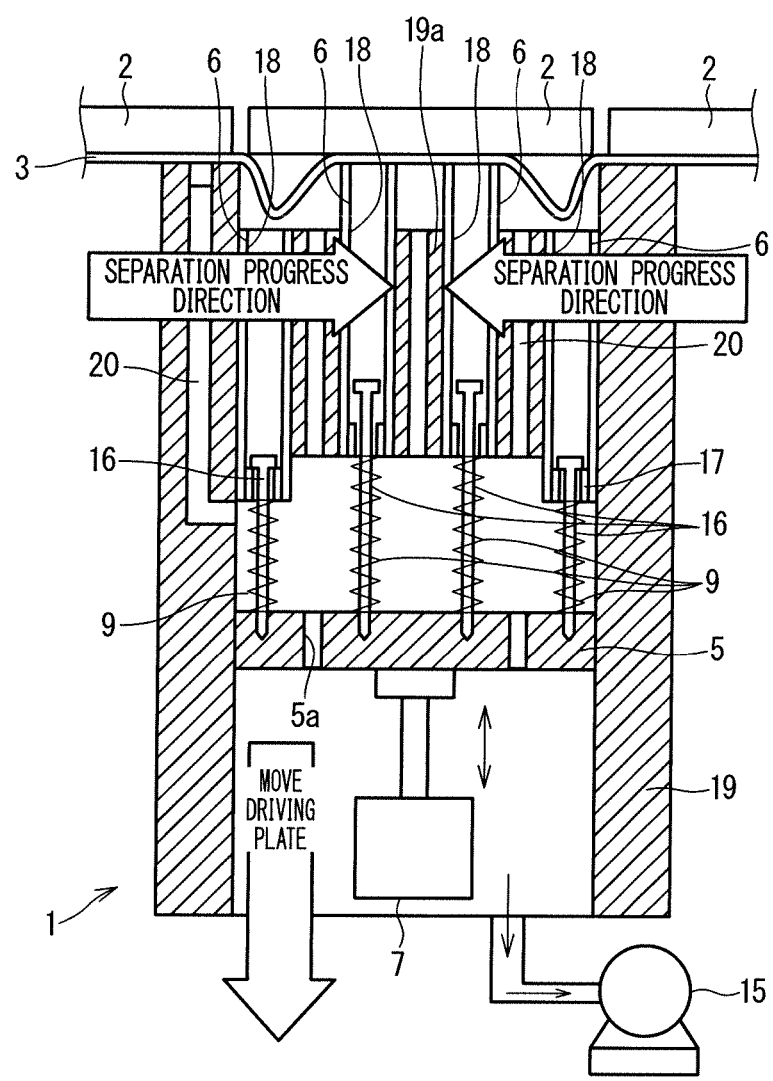
FIG. 8 is a cross-sectional view illustrating a sheet separation operation of the semiconductor manufacturing apparatus according to the modification example 2 of the embodiment 1.

Described next is a procedure of separating the semiconductor device 2 from the sheet 3. FIG. 5 is a flow chart illustrating a procedure of separating the semiconductor device 2 from the sheet 3 in the semiconductor manufacturing apparatus according to the embodiment 1. FIG. 6A is a cross sectional view illustrating a part of a semiconductor manufacturing apparatus according to a modification example 1 of the embodiment 1, and illustrates a state before the sheet 3 to which the semiconductor device 2 is attached is disposed on the sheet separation jig 1. FIG. 6B is a cross sectional view illustrating a part of the semiconductor manufacturing apparatus according to the modification example 1 of the embodiment 1, and illustrates a state where the sheet 3 to which the semiconductor device 2 is attached is disposed on the sheet separation jig 1. FIG. 7 is a cross-sectional view illustrating a part of a semiconductor manufacturing apparatus according to a modification example 2 of the embodiment 1. FIG. 8 is a cross-sectional view illustrating a sheet separation operation of the semiconductor manufacturing apparatus according to the modification example 2 of the embodiment 1.

As illustrated in FIG. 5, firstly, a semiconductor wafer in which the semiconductor device 2 attached to the sheet 3 is formed is disposed on the sheet separation jig 1 (Step S1). Next, the sheet separation jig 1 is positioned on the semiconductor device 2 to be separated, and the sheet 3 and the sheet separation jig 1 are sealed (Step S2). Next, the sheet separation jig 1 sucks the sheet 3 using the first suction source 15 (Step S3).

A member for increasing adhesiveness between the sheet 3 and the sheet separation jig 1 may be provided. Specifically, as illustrated in FIGS. 6A and 6B, an O ring 22 for avoiding a gap between the sheet separation jig 1 and the sheet 3 may be provided on an upper surface of the sheet separation jig 1 having contact with the sheet 3. The gap between the sheet 3 and the upper surface of the sheet separation jig 1 is avoided, thus the inner portion of the sheet separation jig 1 can be stably kept in the vacuum state.

Next, the driving plate 5 in the sheet separation jig 1 is driven downward (Step S4), and sheet separation is started. When the first power source 7 moves the driving plate 5 in a direction in which the support block 6 is away from the sheet 3 and the bolt 16 connected to the driving plate 5 is locked to the protruding part 17 of the support block 6, as illustrated in FIG. 2, the support block 6 (a support block A in FIG. 5) on a left side located on an upstream side of the second direction starts to move downward, thus the sheet 3 starts to be separated from the semiconductor device 2 (Step S5).

A distance from the head part of the bolt 16 to the protruding part 17 of the support block 6 is formed to be increased toward the second direction in the sheet separation jig 1, thus the sheet 3 can be moved in a direction away from the semiconductor device 2 with a time difference caused by a difference of the distance, and a separation can proceed. Thus, after the support block 6 in a center in the second direction (a support block B in FIG. 5) starts to move downward next (Step S6), the support block 6 (a support block C in FIG. 5) on a right side on a downstream side in the second direction starts to move downward. That is to say, all of the support blocks 6 start to move downward (Step S7).

As illustrated in FIG. 7 and FIG. 8, the distance from the head part of the bolt 16 to the protruding part 17 of the support block 6 is set to be symmetric with respect to a center of the semiconductor device 2, thus an effect of reducing a time for completing the separation or stabilizing the separation operation can be obtained. The support block 6 starts to move in the direction away from the sheet 3, and force of separating the sheet 3 from the semiconductor device 2 is generated. A timing at which the support block 6 moves downward is set to be line-symmetric or point-symmetric with respect to the center of the semiconductor device 2, thus when a separation time of separation toward the second direction is defined as 1, a separation time of separation from both sides to the center is approximately 0.5 by reason that the separation from both sides is completed at a midpoint. Accordingly, the separation time can be reduced.

Next, when all of the support blocks 6 move downward and the separation is completed, the collet 4 transfers the semiconductor device 2 separated from the sheet 3 to a tray and places it thereon. That is to say, the collet 4 transfers and places the semiconductor device 2 (Step S8). Then, after all of the support blocks 6 moves upward by the upward driving of the driving plate 5, the sheet separation jig 1 is positioned to the semiconductor device 2 to be separated next (Step S9), and processes similar to Step S3 to Step S9 are performed on the whole surface of the semiconductor wafer.

The semiconductor device 2 which has been separated is housed in the tray, however, the configuration is not limited thereto. The semiconductor device 2 may be fixed to a substrate of a semiconductor manufacture, a tape, or a stage, or the semiconductor device 2 which has been separated may be held by a suction pad for transportation or delivery.

Furthermore, an arrangement of each member of the semiconductor manufacturing apparatus is not limited to the arrangement in the up-down direction illustrated in FIG. 1, for example, in which the collet 4, the semiconductor device 2, the sheet 3, and the sheet separation jig 1 are arranged in this order from an upper side. An arrangement in a lateral direction, specifically, an arrangement of vertically placing the sheet 3 is also applicable.

The separated sheet 3 is not limited to a dicing sheet, however, any sheet-like member is applicable. Furthermore, the first power source 7 may be the other power capable of performing the other straight movement such as a ball screw in place of an air cylinder, and the connection member may be the other rigid body or elastic body in place of the bolt 16.

<Effect>

As described above, the semiconductor manufacturing apparatus according to the embodiment 1 includes: the sheet separation jig 1 having contact with the rear surface of the sheet 3 which is the surface of the sheet 3 on the side opposite to the front surface of the sheet 3, wherein the sheet separation jig 1 includes therein the plurality of support blocks 6 each having the first suction hole 18 formed for sucking the rear surface of the sheet 3 and the single driving plate 5 connected to the plurality of support blocks 6 so that the plurality of support blocks 6 can move in the first direction as the direction away from the sheet 3 with the time difference, and the plurality of support blocks 6 are disposed in the sheet separation jig 1 along the second direction along, as the direction of the separation of the semiconductor device 2 from the sheet 3, intersecting the first direction.

Accordingly, the plurality of support blocks 6 move in the direction away from the sheet 3 with the time difference by the single driving plate 5, thus the semiconductor device 2 formed in the outer peripheral part of the semiconductor wafer can be picked up with a simple configuration, and a crack occurring in the semiconductor device 2 at the time of separating the semiconductor device 2 from the sheet 3 can be suppressed.

The structure is simplified, thus a size of the semiconductor manufacturing apparatus and a manufacturing cost thereof are reduced, and moreover, a failure risk of the semiconductor manufacturing apparatus can be suppressed. According to the above configuration, yield of the semiconductor device 2 manufactured by the semiconductor manufacturing apparatus can be increased.

The bolt 16 as the connection member connecting each support block 6 and the driving plate 5 is inserted through each first suction hole 18, and the end portion of each bolt 16 on the side of the support block 6 and the protruding part 17 provided on the side of the driving plate 5 in each support block 6 can be locked to each other.

Accordingly, the bolt 16 is adopted as the connection member, thus the sheet separation jig 1 can be simply configured, and this leads to a simple configuration of the semiconductor manufacturing apparatus.

The length of the bolt 16 is different for each support block 6 and increases toward the second direction, and the bolts 16 sequentially move in the first direction in order of increasing length of the bolt 16 by the driving of the driving plate 5, thus the support block 6 connected to the bolt 16 also moves in the first direction in conjunction with the bolt 16.

Accordingly, the plurality of support blocks 6 sequentially move in the first direction toward the second direction, thus the separation of the sheet 3 can effectively proceed.

The semiconductor manufacturing apparatus includes at least three bolts 16, and the two bolts 16 in at least three bolts 16 have the same length. Accordingly, the timing at which the support block 6 moves downward can be synchronized at two positions, thus the separation of the sheet 3 can effectively proceed.

The semiconductor manufacturing apparatus further includes the first suction source 15 sucking the inner portion of the sheet separation jig 1, thus the inner portion of the sheet separation jig 1 can be stably kept in the vacuum state.

The timing at which the plurality of support blocks 6 move in the first direction is set to be symmetric with respect to the center of the semiconductor device 2. Accordingly, the separation operation of the sheet 3 is set to be symmetric with respect to the center of the semiconductor device 2, thus the separation time of separating the sheet 3 can be reduced, and the separation operation can be stabilized.

The semiconductor manufacturing apparatus further includes the collet 4 disposed on the surface of the semiconductor device 2 on the side opposite to the surface thereof having contact with the sheet 3, and the collet 4 sucks and holds the semiconductor device 2. Accordingly, the semiconductor device 2 counters force of being pulled by the sheet 3 when the separation of the sheet 3 proceeds, thus the sheet 3 can be easily separated.

The sheet 3 is sucked by suction force of the first suction source 15. Accordingly, the sheet 3 can be sucked in the support block 6, thus force for separating the sheet 3 is applied more strongly at the time of operation of the support block 6, and the separation operation of the sheet 3 is stabilized.

The O ring 22 for avoiding the gap between the sheet separation jig 1 and the sheet 3 is provided on the surface of the sheet separation jig 1 having contact with the sheet 3. Accordingly, the inner portion of the sheet separation jig 1 can be stably kept in the vacuum state.

Embodiment 2

Figure 9:
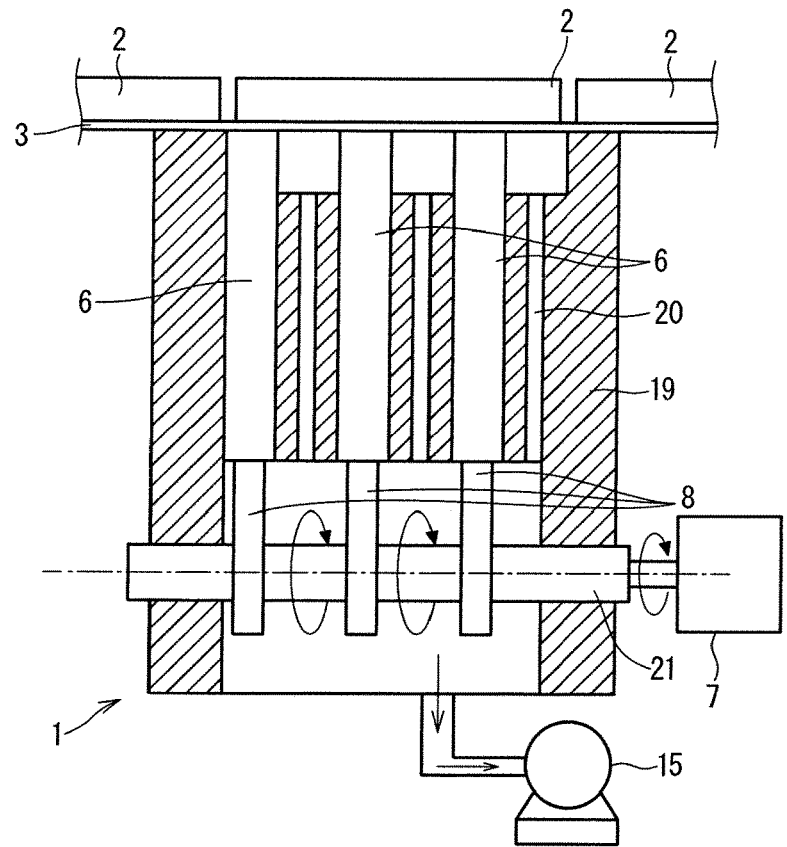
FIG. 9 is a cross-sectional view illustrating a part of a semiconductor manufacturing apparatus according to an embodiment 2.
Figure 10:
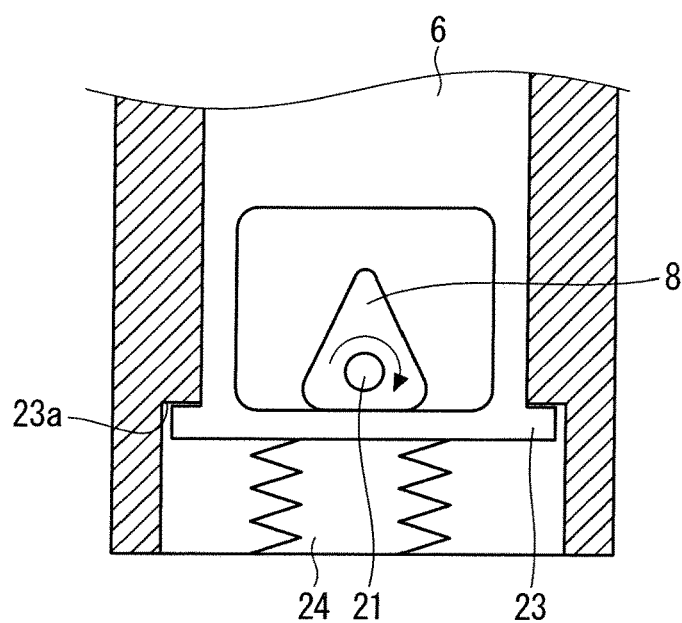
FIG. 10 is a cross-sectional view illustrating a relationship between a support block and a cam included in a semiconductor manufacturing apparatus according a modification example of the embodiment 2.

A semiconductor manufacturing apparatus according to an embodiment 2 is described next. FIG. 9 is a cross-sectional view illustrating a part of the semiconductor manufacturing apparatus according to the embodiment 2. FIG. 10 is a cross-sectional view illustrating a relationship between the support block 6 and a cam 8 included in a semiconductor manufacturing apparatus according a modification example of the embodiment 2. In the description in the embodiment 2, the same reference numerals are assigned to the same constituent elements as those described in the embodiment 1, and the description thereof will be omitted.

As illustrated in FIG. 9 and FIG. 10, the cam 8 is adopted as a means for moving the support block 6 in the embodiment 2. The sheet separation jig 1 includes the plurality of (three, for example) support blocks 6, a single cam shaft 21 as a drive member, and the plurality of (three, for example) cams 8.

The three support blocks 6 are connected to the cam shaft 21 via the three cams 8 each having a phase different from each other. The three cams 8 are eccentric cams provided on the cam shaft 21 and each having a shape different from each other, and are rotated around the cam shaft 31 as a rotational axis. A lower end of each support block 6 has direct contact with a peripheral surface of each cam 8, and the three cams 8 are rotated by rotary drive of the cam shaft 21, thus the three support blocks 6 can move downward as the first direction with the time difference.

The three cams 8 are the eccentric cams, thus have regions having a long distance and a short distance from the rotational axis. The three cams 8 are sequentially rotated to be located in the region having a short distance from the rotational axis toward the second direction for each support block 6, thus the support block 6 connected to the cam 8 also moves downward in conjunction with the cam 8.

In the meanwhile, the three cams 8 are rotated to be located in the region having a long distance from the rotational axis, thus the support block 6 connected to the cam 8 also moves upward in conjunction with the cam 8. Herein, a state where the cam 8 is located in the region having a short distance from the rotational axis indicates that the region having the short distance from the rotational axis in the cam 8 has direct contact with the support block 6, and a state where the cam 8 is located in the region having a long distance from the rotational axis indicates that the region having the long distance from the rotational axis in the cam 8 has direct contact with the support block 6.

Power of rotating the cam shaft 21 and the cam 8 is appropriate for the first power source 7, and a motor is assumed to the power. However, the power is not limited thereto, but any power source is applicable as long as it can rotationally drive the cam shaft 21.

The cam 8 may be disposed not only on the lower end of the support block 6 to have direct contact therewith but also in the first suction hole 18 of the support block 6 as illustrated in FIG. 10. An elastic member 24 biasing the support block 6 upward is provided on the lower end of the support block 6. A protruding part 23 protruding to an outer peripheral side is provided on a lower end portion of the support block 6, and a concave portion 23*a* to which the protruding part 23 can be locked is provided in the sheet separation jig 1, thus prevented is a movement of the support block 6 to an upper side than a predetermined height position.

Each cam 8 is disposed to have direct contact with a bottom wall in the support block 6. In this case, the three cams 8 are sequentially rotated to be located in the region having a long distance from the rotational axis toward the second direction for each support block 6, thus the support block 6 connected to the cam 8 also moves downward in conjunction with the cam 8. In the meanwhile, the three cams 8 are rotated to be located in the region having a short distance from the rotational axis, thus, the support block 6 connected to the cam 8 also moves upward in conjunction with the cam 8.

The configuration thereof is not limited to the protruding part 23, however, any mechanism is applicable as long as it can prevent the upward movement of the support block 6, thus the mechanism may be provided on a side of the sheet separation jig 1 or an upper end side of the support block 6.

Although not illustrated in the drawings, two cams 8 in three cams 8 may have the same phase. Specifically, a timing at which the support block 6 moves downward may be set to be line-symmetric or point-symmetric with respect to the center of the semiconductor device 2.

As described above, in the semiconductor manufacturing apparatus according to the embodiment 2, the plurality of support blocks 6 are connected to the cam shaft 21 via the plurality of cams 8 each having the different phase, and the plurality of cams 8 are rotated by driving of the cam shaft 21, thus the plurality of support blocks 6 can move in the first direction with the time difference.

Accordingly, the mechanism operating the plurality of support blocks 6 is simplified more than the case in the embodiment 1, thus also an adjustment thereof is performed more easily than the case in the embodiment 1. Furthermore, the distance from the support block 6 to the drive member is shorter than the case in the embodiment 1, thus this configuration has an advantage in a case where a dimension of the sheet separation jig 1 in the up-down direction cannot be ensured.

Each cam 8 is disposed in each first suction hole 18. Accordingly, torque of an reciprocating operation of a downward movement to a side of separation and an upward movement to a return side in the support block 6 can be stably exerted, thus it can be suppressed that the support block 6 cannot move to the side of separation due to lack of torque.

The plurality of cams 8 are eccentric cams, and are sequentially rotated toward the second direction for each support block 6 by the driving of the cam shaft 21, thus the support block 6 connected to the cam 8 also moves in the first direction in conjunction with the cam 8.

Accordingly, the plurality of support blocks 6 sequentially move in the first direction toward the second direction, thus the separation of the sheet 3 can effectively proceed.

The semiconductor manufacturing apparatus includes at least three cams 8, and two cams 8 in at least three cams 8 have the same phase. Accordingly, the timing at which the support block 6 moves downward can be synchronized at two positions, thus the separation of the sheet 3 can effectively proceed.

Embodiment 3

Figure 11:
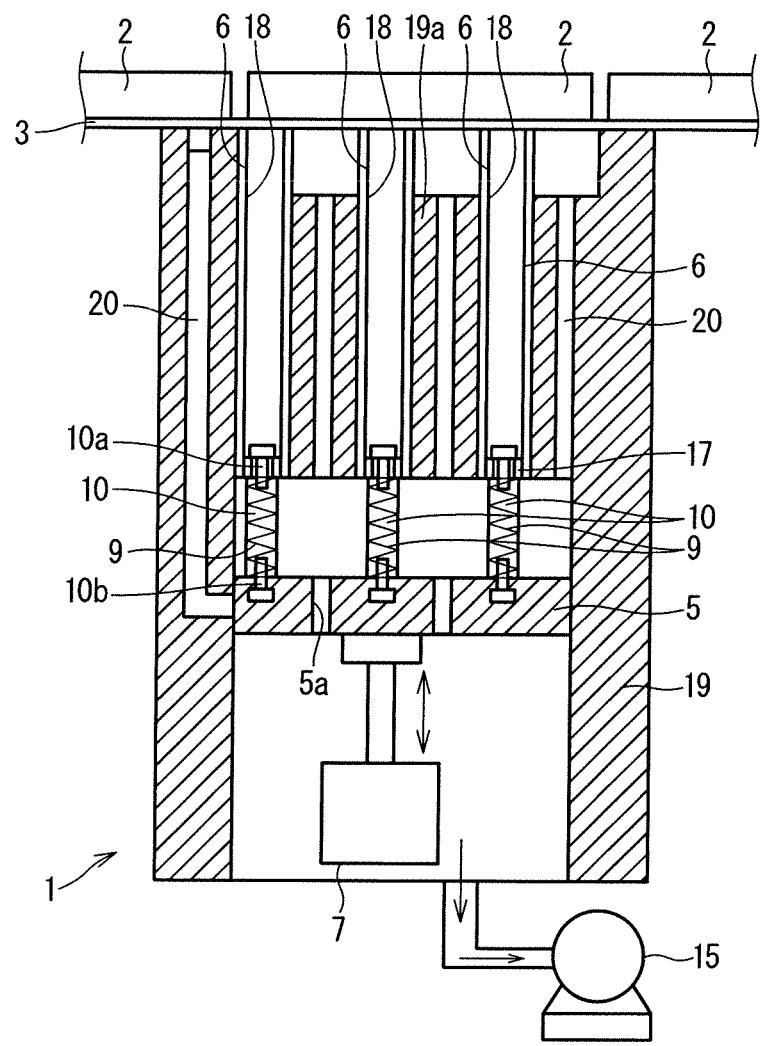
FIG. 11 is a cross-sectional view illustrating a part of a semiconductor manufacturing apparatus according to an embodiment 3.

A semiconductor manufacturing apparatus according to an embodiment 3 is described next. FIG. 11 is a cross-sectional view illustrating a part of the semiconductor manufacturing apparatus according to the embodiment 3. In the description in the embodiment 3, the same reference numerals are assigned to the same constituent elements as those described in the embodiments 1 and 2, and the description thereof will be omitted.

As illustrated in FIG. 11, an elastic body 10 (corresponding to a first elastic body) is adopted as a means for moving the support block 6 in the embodiment 3. Rubber is assumed as the elastic body 10, and other member such as a winding spring or an air spring is also applicable as long as it can be elastically deformed.

The sheet separation jig 1 includes the plurality of (three, for example) support blocks 6, a single driving plate 5 as a drive member, and a plurality of (three, for example) elastic bodies 10. The three support blocks 6 are connected to the driving plate 5 via the three elastic bodies 10 each having a different elastic coefficient. Specifically, an upper end of the elastic body 10 is connected to the lower end of the support block 6 by a bolt 10*a*, and a lower end of the elastic body 10 is connected to the upper surface of the driving plate 5 by the bolt 10*b*. Each elastic body 10 with the helical coil spring 9 (corresponding to a second elastic body), which has an elastic coefficient different from the elastic body 10, attached thereto is disposed between each support block 6 and the driving plate 5. The three helical coil springs 9 have the same elastic coefficient.

The three elastic bodies 10 are disposed to have a larger elastic coefficient toward the second direction so that the three support blocks 6 can move downward as the first direction from the elastic body 10 having a small elastic coefficient with the time difference by the driving of the driving plate 5. In the meanwhile, the three support blocks 6 simultaneously move upward by the upward driving of the driving plate 5.

When load of the helical coil spring 9 applying force on the support block 6 in a direction getting close to the sheet 3 is defined as load A and load of the elastic body 10 applying force on the support block 6 in a direction away from the sheet 3 is defined as load B, the following effect can be obtained by conditions hereinafter.

In a region a satisfying the load A≥the load B, the driving plate 5 starts to move in a direction separating the support block 6 from the sheet 3, and the load B is generated, however, the load A is larger than or equal to the load B, thus the support block 6 does not move.

In a region b satisfying the load A<the load B, the load B generated when the driving plate 5 moves in a direction separating the support block 6 from the sheet 3 is larger than force of the load A staying the support block 6, thus the support block 6 starts to move in the direction away from the sheet 3.

An effect of cancelling variation of an elastic coefficient of the elastic body 10 can be obtained by combining these regions, and variation of the timing of start of separation can be minimized.

Although not shown in the drawings, the two elastic bodies 10 in the three elastic bodies 10 may have the same elastic coefficient. Specifically, a timing at which the support block 6 moves downward may be set to be line-symmetric or point-symmetric with respect to the center of the semiconductor device 2.

As described above, in the semiconductor manufacturing apparatus according to the embodiment 3, the plurality of support blocks 6 are connected to the driving plate 5 via the plurality of elastic bodies 10 each having the different elastic coefficient, and the plurality of support blocks 6 can move in the first direction with the time difference by the driving of the driving plate 5.

Accordingly, the length of the bolt 16 is changed in the embodiment 1, however, only the elastic coefficient of the elastic body 10 needs to be changed in the embodiment 3, thus the semiconductor manufacturing apparatus can be configured more simply than the case in the embodiment 1.

The plurality of elastic bodies 10 are disposed to have a larger elastic coefficient toward the second direction, and sequentially move in the first direction in order of increasing elastic coefficient of the elastic body 10 by the driving of the driving plate 5, thus the support block 6 connected to the elastic body 10 also moves in the first direction in conjunction with the elastic body 10.

Accordingly, the plurality of support blocks 6 sequentially move in the first direction toward the second direction, thus the separation of the sheet 3 can effectively proceed.

The semiconductor manufacturing apparatus includes at least three elastic bodies 10, and two elastic bodies 10 in at least three elastic bodies 10 have the same elastic coefficient. Accordingly, the timing at which the support block 6 moves downward can be synchronized at two positions, thus the separation of the sheet 3 can effectively proceed.

Each support block 6 is connected to the driving plate 5 via the elastic body 10 and the helical coil spring 9 having the elastic coefficient different from the elastic body 10. Accordingly, even when the driving plate 5 starts to move in the direction separating the support block 6 from the sheet 3, start of movement of the support block 6 can be avoided until the load on the elastic body 10 exceeds initial load of the elastic body 10.

Embodiment 4

Figure 12:
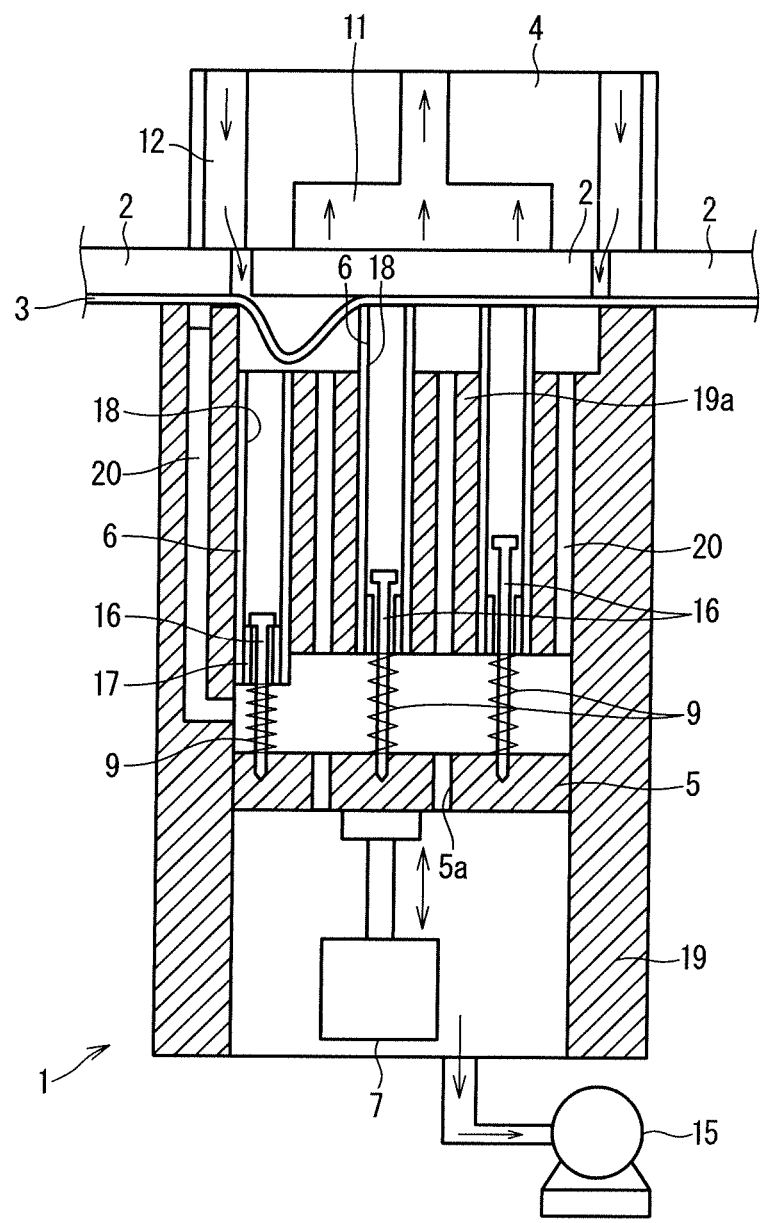
FIG. 12 is a cross-sectional view illustrating a part of a semiconductor manufacturing apparatus according to an embodiment 4.

A semiconductor manufacturing apparatus according to an embodiment 4 is described next. FIG. 12 is a cross-sectional view illustrating a part of the semiconductor manufacturing apparatus according to the embodiment 4. In the description in the embodiment 4, the same reference numerals are assigned to the same constituent elements as those described in the embodiments 1 to 3, and the description thereof will be omitted.

In the description in the embodiments 1 to 3, the collet 4 has the function of performing vacuum suction on the semiconductor device 2. As illustrated in FIG. 12, in the embodiment 4, the collet 4 performs vacuum suction on the semiconductor device 2, and further includes an air blowing part 12 blowing air for increasing air pressure in the outer peripheral part of the semiconductor device 2 from the outer peripheral side of the semiconductor device 2. An outline form of the collet 4 in a top view is formed to be larger than an outline form of the semiconductor device 2 in a top view, and the air blowing part 12 is provided in a part of the collet 4 facing the outer peripheral side of the semiconductor device 2. Accordingly, pressure in a space between the semiconductor device 2 and the sheet 3 is increased, thus progress of the separation of the sheet 3 can be promoted.

The outer peripheral side of the semiconductor device 2 may be a part including the outer peripheral part of the semiconductor device 2, or may also be a part which does not include the outer peripheral part of the semiconductor device 2 but is located on an outer side of the outer peripheral part of the semiconductor device 2.

As for the air blowing from the air blowing part 12, air exhausted by an ejector mechanism (not shown) adopted to obtain a vacuum source for sucking the semiconductor device 2 by a suction part 11 can be reused.

As described above, in the semiconductor manufacturing apparatus according to the embodiment 4, the outline form of the collet 4 in a top view is formed to be larger than the outline form of the semiconductor device 2 in a top view, and the collet 4 blows air from the outer peripheral side of the semiconductor device 2, thus progress of the separation of the sheet 3 can be promoted.

The air blown from the collet 4 is exhaust air exhausted at the time of sucking the semiconductor device 2. Accordingly, the ejector mechanism can be unified by reusing the air exhausted for obtaining the vacuum source for sucking the semiconductor device 2. Accordingly, the configuration of the semiconductor manufacturing apparatus is simplified.

Embodiment 5

Figure 13:
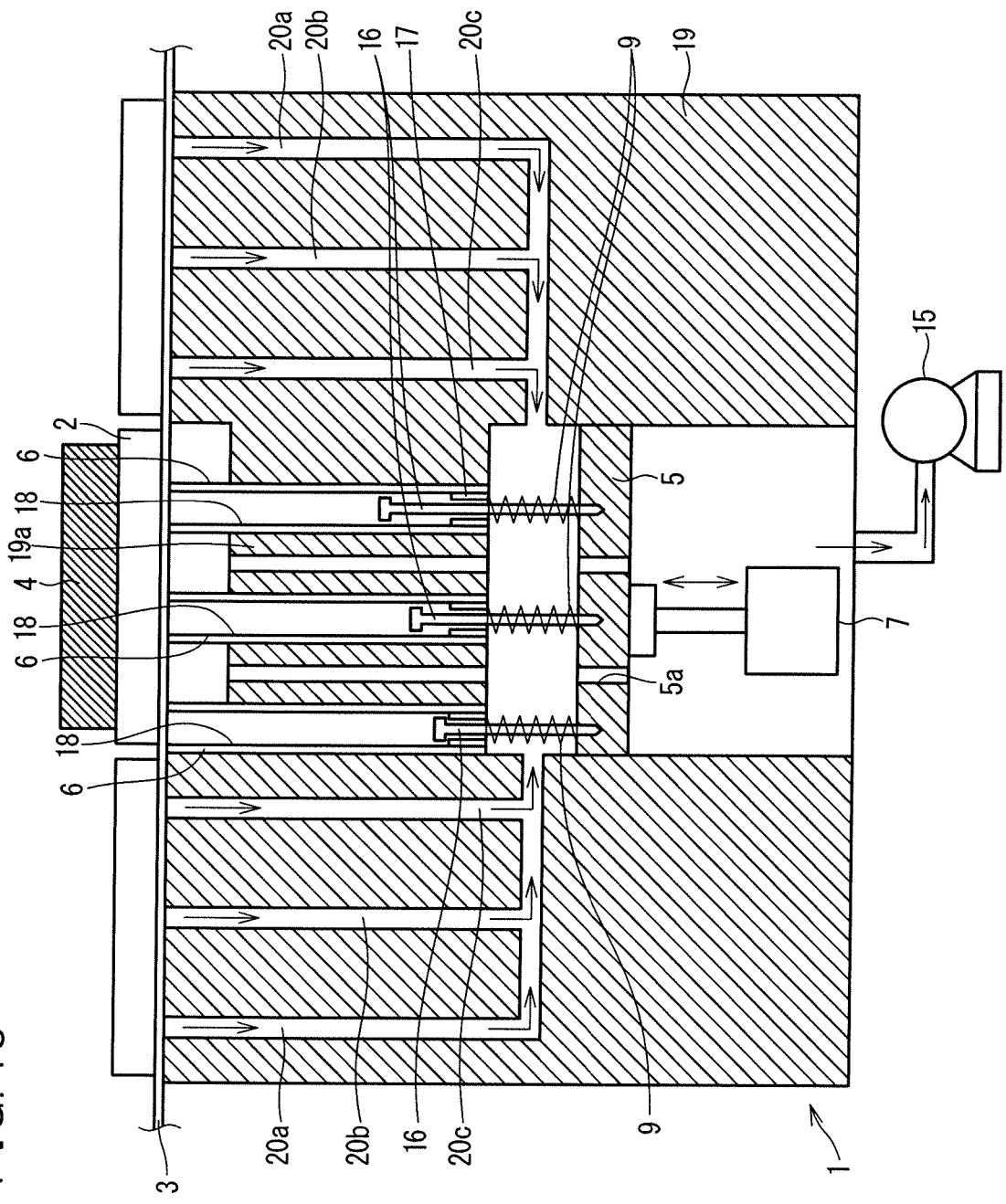
FIG. 13 is a cross-sectional view illustrating a part of a semiconductor manufacturing apparatus according to an embodiment 5.
Figure 14:
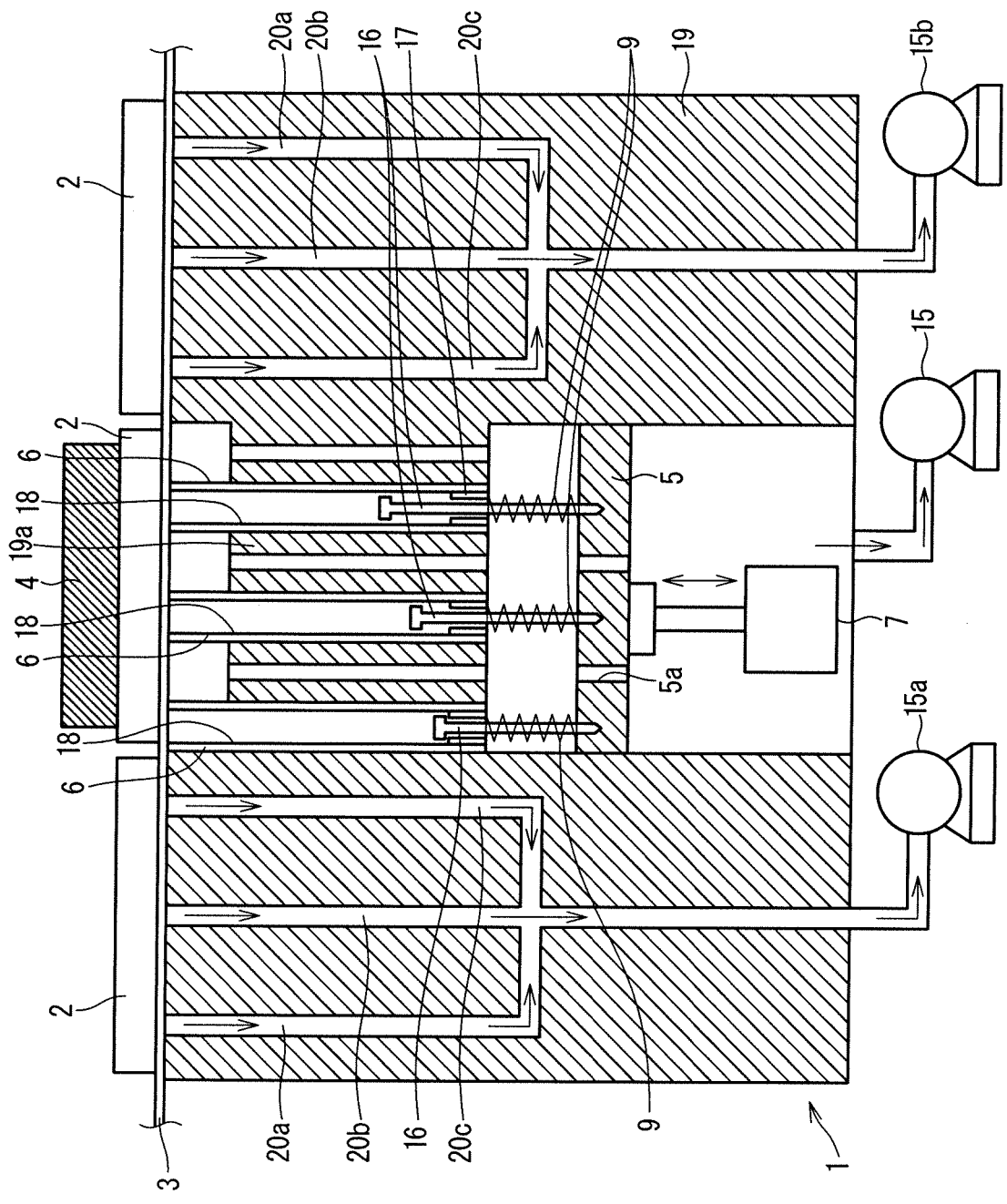
FIG. 14 is a cross-sectional view illustrating a part of a semiconductor manufacturing apparatus according to a modification example of the embodiment 5.

A semiconductor manufacturing apparatus according to an embodiment 5 is described next. FIG. 13 is a cross-sectional view illustrating a part of the semiconductor manufacturing apparatus according to the embodiment 5. FIG. 14 is a cross-sectional view illustrating a part of a semiconductor manufacturing apparatus according to a modification example of the embodiment 5. In the description in the embodiment 5, the same reference numerals are assigned to the same constituent elements as those described in the embodiments 1 to 4, and the description thereof will be omitted.

As illustrated in FIG. 13, the sheet separation jig 1 has a size large enough to place the plurality of semiconductor devices 2 thereon in the embodiment 5.

The upper surface of the sheet separation jig 1 has a size large enough to place the semiconductor device 2 adjacent to the semiconductor device 2 to be separated, thus force of sucking the sheet 3 is increased. Accordingly, even when the collet 4 performs an operation of transferring the semiconductor device 2 in a direction away from the sheet 3 in a case where the separation of the sheet 3 is insufficiently performed, suppressed is that the sheet 3 follows the transfer of the semiconductor device 2.

The sheet separation jig 1 further includes second suction holes 20*a*, 20*b*, and 20*c* provided on an outer peripheral side of the three support blocks 6, and the second suction holes 20*a*, 20*b*, and 20*c* suck a part of the sheet 3 located on an outer peripheral side of the semiconductor device 2 held by the collet 4. The second suction holes 20*a*, 20*b*, and 20*c* are provided in the sidewall 19, and are connected to the first suction source 15 through the inner portion of the sheet separation jig 1. The first suction source 15 also sucks the second suction holes 20a, 20b, and 20c in addition to the first suction hole 18.

As illustrated in FIG. 14, the semiconductor manufacturing apparatus may further include second suction sources 15a and 15b sucking the second suction holes 20a, 20b, and 20c. The second suction source 15a sucks a part of the sheet 3 facing the semiconductor device 2 on a left side in FIG. 14, and the second suction source 15b sucks a part of the sheet 3 facing the semiconductor device 2 on a right side in FIG. 14. The suction sources are separately provided in the semiconductor device 2 to be separated and the adjacent semiconductor device 2, thus variation of a combination of the suction of the sheet 3 and separation control is increased. The suction source can be used in accordance with various demands.

A holding mechanism (not shown) of holding the collet 4 is necessary to hold the collet 4, however, an optional design is applicable.

As described above, in the semiconductor manufacturing apparatus according to the embodiment 5, the sheet separation jig 1 further includes the second suction holes 20a, 20b, and 20c provided on the outer peripheral side of the plurality of support blocks 6, and the second suction holes 20a, 20b, and 20c suck a part of the sheet 3 located on the outer peripheral side of the semiconductor device 2 held by the collet 4.

Accordingly, even in the case where the separation of the sheet 3 is insufficiently performed when the collet 4 performs the operation of transferring the semiconductor device 2 in the direction away from the sheet 3, force of sucking the sheet 3 is increased and lifting of the sheet 3 is suppressed, thus the separation operation of the sheet 3 is stabilized.

The semiconductor manufacturing apparatus further includes the second suction sources 15a and 15b sucking the second suction holes 20a, 20b, and 20c. Suction force of the sheet 3 can be controlled, thus the sheet 3 can have appropriate tensile force.

Other Modification Example

The O ring 22 described in the embodiment 1 may be adopted to the semiconductor manufacturing apparatus according to the embodiments 2 to 5. The collet 4 with the air blowing part 12 described in the embodiment 4 may be adopted to the semiconductor manufacturing apparatus according to the embodiments 1 to 3 and 5. The structure of the sheet separation jig 1 and the second suction sources 15a and 15b described in the embodiment 5 may be adopted to the semiconductor manufacturing apparatus according to the embodiments 1 to 4.

Each embodiment can be arbitrarily combined, or each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor manufacturing apparatus for separating a semiconductor device attached to a front surface of a sheet from the sheet, comprising
    a die having contact with a rear surface of the sheet which is a surface of the sheet on a side opposite to the front surface of the sheet, wherein
    the die includes therein a plurality of support blocks, each of which includes a first suction hole formed for sucking the rear surface of the sheet, and a single driver connected to the plurality of support blocks so that the plurality of support blocks can move in a first direction as a direction away from the sheet with a time difference, and
    the plurality of support blocks are disposed in the die along a second direction, as a direction of a separation of the semiconductor device from the sheet, intersecting the first direction.

2. The semiconductor manufacturing apparatus according to claim 1, wherein
    a plurality of connectors, each connector of the plurality of connectors connecting a respective support block and the driver is inserted through each of the first suction holes, and
    an end portion of the connector on a side of each of the support blocks and a protruding part provided on a side of the driver in each of the support blocks can be locked to each other.

3. The semiconductor manufacturing apparatus according to claim 2, wherein
    at least two of the plurality of connectors have a different length for the respective support blocks, and the length of the connectors increases toward the second direction, and
    the connectors sequentially move in the first direction in order of increasing length of the connectors by driving of the driver, thus each of the support blocks connected to the a respective connector also moves in the first direction in conjunction with the connector.

4. The semiconductor manufacturing apparatus according to claim 3, further comprising
    at least three connectors as the connectors, wherein
    two connectors of the at least three connectors have an identical length.

5. The semiconductor manufacturing apparatus according to claim 1, wherein
    the plurality of support blocks are connected to the driver via a plurality of cams, at least two of which have a different phase, and
    the plurality of cams are rotated by driving of the driver, thus the plurality of support blocks can move in the first direction with a time difference.

6. The semiconductor manufacturing apparatus according to claim 5, wherein
    each of the cams is disposed in each of the first suction holes.

7. The semiconductor manufacturing apparatus according to claim 5, wherein
    the plurality of cams are eccentric cams, and
    the plurality of cams are sequentially rotated toward the second direction for each of the support blocks by driving of the driver, thus the plurality of support blocks connected to the cams also move in the first direction in conjunction with the cams.

8. The semiconductor manufacturing apparatus according to claim 5, further comprising
    at least three cams as the cams, and
    two cams in the at least three cams have an identical phase.

9. The semiconductor manufacturing apparatus according to claim 1, wherein
    the plurality of support blocks are connected to the driver via a plurality of first elastic connectors, at least two of which have each having a different elastic coefficient, and the plurality of support blocks can move in the first direction with a time difference by driving of the driver.

10. The semiconductor manufacturing apparatus according to claim 9, wherein
the plurality of first elastic connectors are disposed to have a larger elastic coefficient toward the second direction, and
the plurality of first elastic connectors sequentially move in the first direction in order of increasing elastic coefficient by driving of the driver, thus the support blocks connected to the first elastic connectors also move in the first direction in conjunction with the first elastic connectors.

11. The semiconductor manufacturing apparatus according to claim 9, further comprising
at least three first elastic connectors as the first elastic connectors, and
two first elastic connectors in the at least three first elastic connectors have an identical elastic coefficient.

12. The semiconductor manufacturing apparatus according to claim 9, wherein
each of the support blocks is connected to the driver via the first elastic connectors and second elastic connectors having an elastic coefficient different from the first elastic connectors.

13. The semiconductor manufacturing apparatus according to claim 1, further comprising
a first suction source sucking an inner portion of the die.

14. The semiconductor manufacturing apparatus according to claim 13, further comprising
a semiconductor device attached to the front surface of the sheet,
a collet disposed on a surface of the semiconductor device on a side opposite to a surface of the semiconductor device having contact with the sheet, wherein
the collet sucks and holds the semiconductor device.

15. The semiconductor manufacturing apparatus according to claim 14, wherein
a periphery of the semiconductor device is smaller than a periphery of the collet, and
the collet blows air from an outer peripheral side of the semiconductor device.

16. The semiconductor manufacturing apparatus according to claim 15, wherein
the air blown from the collet is exhaust air exhausted at a time of sucking the semiconductor device.

17. The semiconductor manufacturing apparatus according to claim 14, wherein
the die further includes second suction holes provided on an outer peripheral side of the plurality of support blocks, and
the second suction holes suck a part of the sheet located on an outer peripheral side of the semiconductor device held by the collet.

18. The semiconductor manufacturing apparatus according to claim 17, further comprising
second suction sources sucking the second suction holes.

19. The semiconductor manufacturing apparatus according to claim 13, wherein
the sheet is sucked by suction force of the first suction source.

20. The semiconductor manufacturing apparatus according to claim 1, wherein
a timing at which the plurality of support blocks move in the first direction is symmetric with respect to a center of the semiconductor device.

21. The semiconductor manufacturing apparatus according to claim 1, wherein
an O ring for avoiding a gap between the die and the sheet is provided on a surface of the die having contact with the sheet.

22. A method of manufacturing a semiconductor device using the semiconductor manufacturing apparatus according to claim 1, comprising:
(a) setting a semiconductor wafer in which the semiconductor device attached to the sheet is formed;
(b) sucking the sheet by the plurality of first suction holes of the die; and
(c) sequentially moving the plurality of support blocks in the first direction toward the second direction by driving of the driver.

* * * * *